United States Patent [19]
Turner et al.

[11] Patent Number: 5,839,455
[45] Date of Patent: Nov. 24, 1998

[54] ENHANCED HIGH PRESSURE CLEANSING SYSTEM FOR WAFER HANDLING IMPLEMENTS

[75] Inventors: Virgil Q. Turner, Sugarland; William D. Light, Richmond; Hilario T. Trevino, Needville; Richard L. Guldi, Dallas; Frank Poag, Plano; Douglas E. Paradis, Richardson, all of Tex.

[73] Assignee: Texas Instruments Incorporated, Dallas, Tex.

[21] Appl. No.: 422,331

[22] Filed: Apr. 13, 1995

[51] Int. Cl.⁶ ........................................................ B08B 3/02
[52] U.S. Cl. ..................... 134/57 R; 134/95.1; 134/155; 134/186; 134/902; 15/319; 15/339
[58] Field of Search ................... 15/404, 309.2, 15/319, 339; 134/56 R, 57 R, 58 R, 95.1, 102.1, 103.1, 155, 186, 902

[56] References Cited

U.S. PATENT DOCUMENTS

| | | | |
|---|---|---|---|
| 2,602,003 | 7/1952 | Wellborn | 15/309.2 |
| 3,373,552 | 3/1968 | Scherr | 15/309.2 |
| 3,805,317 | 4/1974 | Dickinson | 15/309.2 |
| 3,939,526 | 2/1976 | Mania et al. | 15/309.2 |
| 4,141,103 | 2/1979 | Crise | 15/404 |
| 4,364,147 | 12/1982 | Biedremann et al. | 15/404 |
| 4,411,038 | 10/1983 | Mukai | 15/309.2 |
| 4,800,611 | 1/1989 | Toriwaki et al. | 15/309.2 |
| 4,991,253 | 2/1991 | Rechsteiner | 15/319 |
| 5,243,494 | 9/1993 | Cotner et al. | |
| 5,279,017 | 1/1994 | Foreshew | 15/309.2 |
| 5,437,732 | 8/1995 | Igarashi et al. | 15/319 |
| 5,504,972 | 4/1996 | Tada et al. | 15/404 |

Primary Examiner—Frankie L. Stinson
Attorney, Agent, or Firm—W. James Brady, III; Richard L. Donaldson

[57] ABSTRACT

Methods and apparatus are providing for cleansing contaminants from substrates, such as semiconductor wafer handling implements, and thereby reduce the incidence of contamination of semiconductor devices being assembled upon the semiconductor wafers.

In one aspect of the invention, a substrate such as a semiconductor cassette or other semiconductor wafer handling implement, is inserted into a chamber that is substantially isolated from a surrounding environment. A pressurized, and optionally purified, cleansing medium is directed against at least one surface of the substrate to dislodge contaminants from the substrate surface. Dislodged contaminants are evacuated with negative pressure from the chamber. In a preferred aspect of the invention, the cleansing medium is an inert gas, such as nitrogen, and is applied to the substrate at a pressure from about 10 p.s.i. to about 100 or more p.s.i. The chamber can be provided with sidewalls define a convergent evacuation path that is in fluid communication with an exhaust stream, such as the exhaust stack of the manufacturing facility.

15 Claims, 6 Drawing Sheets

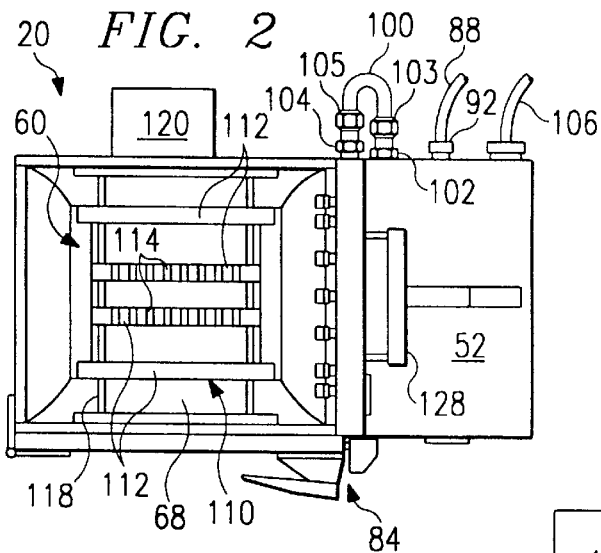
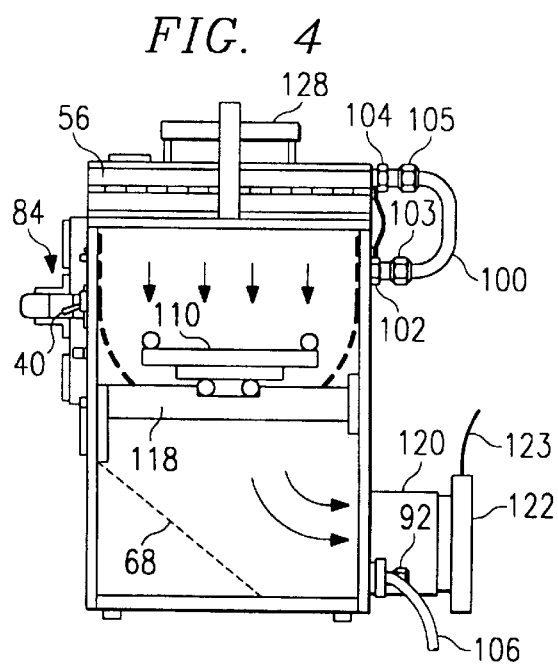
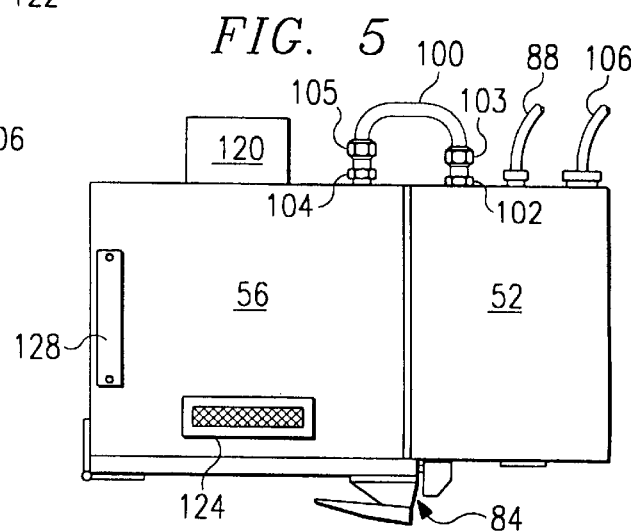

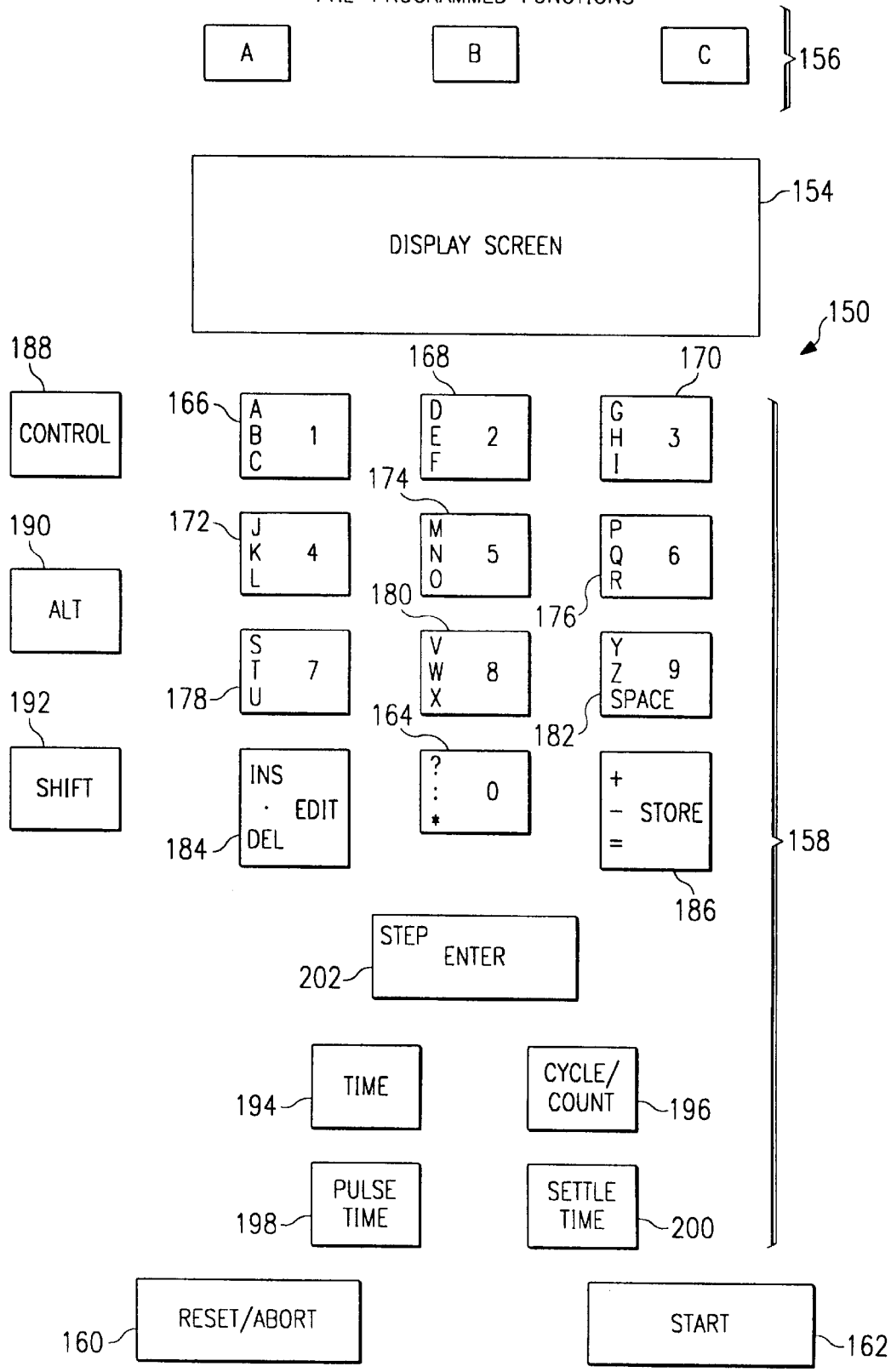

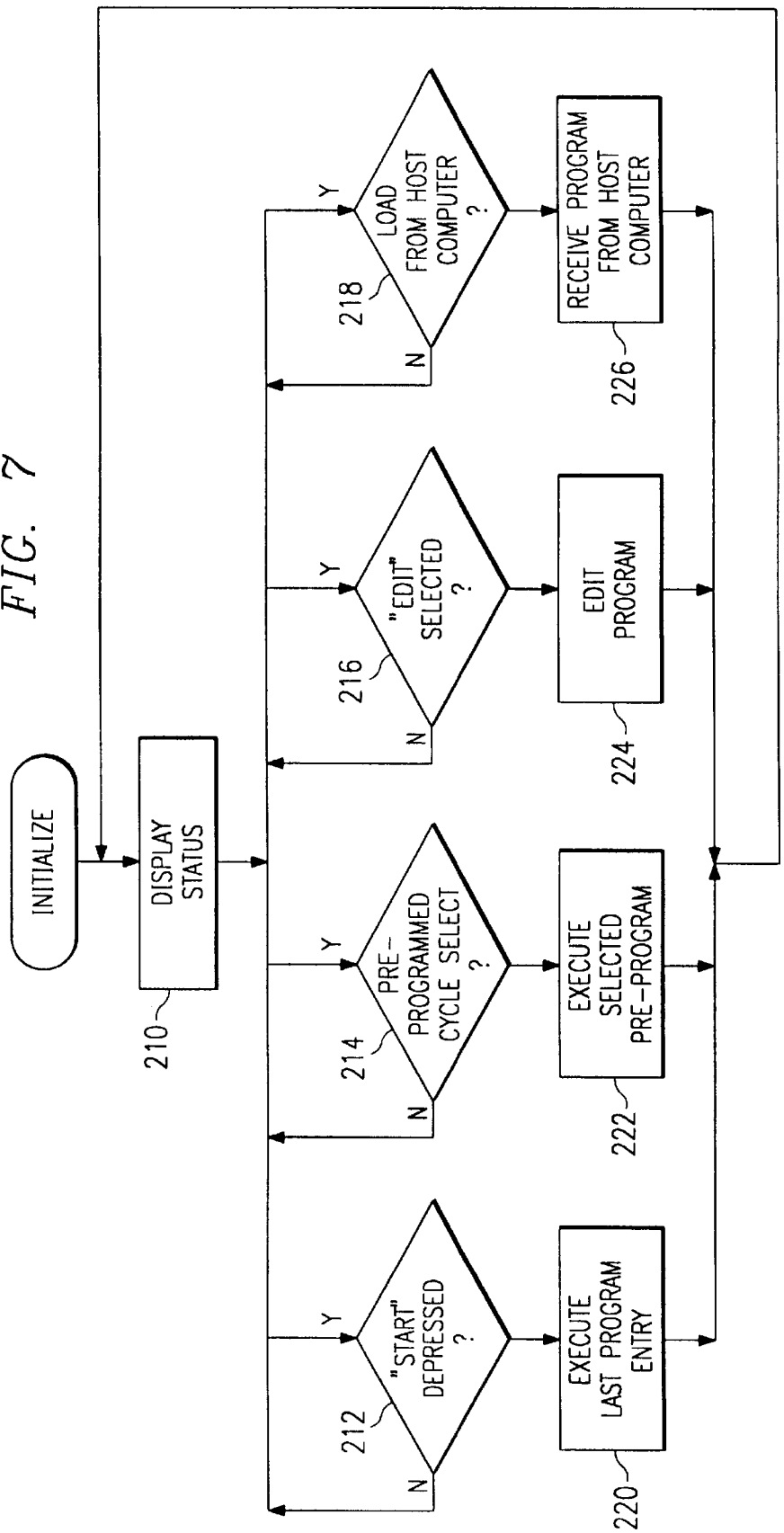

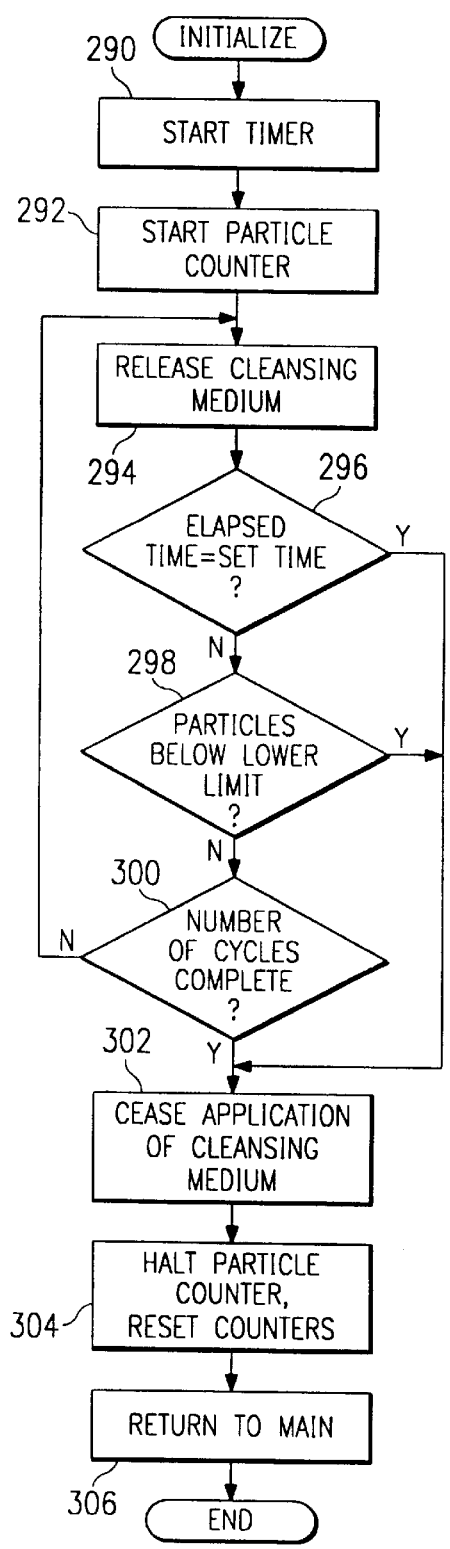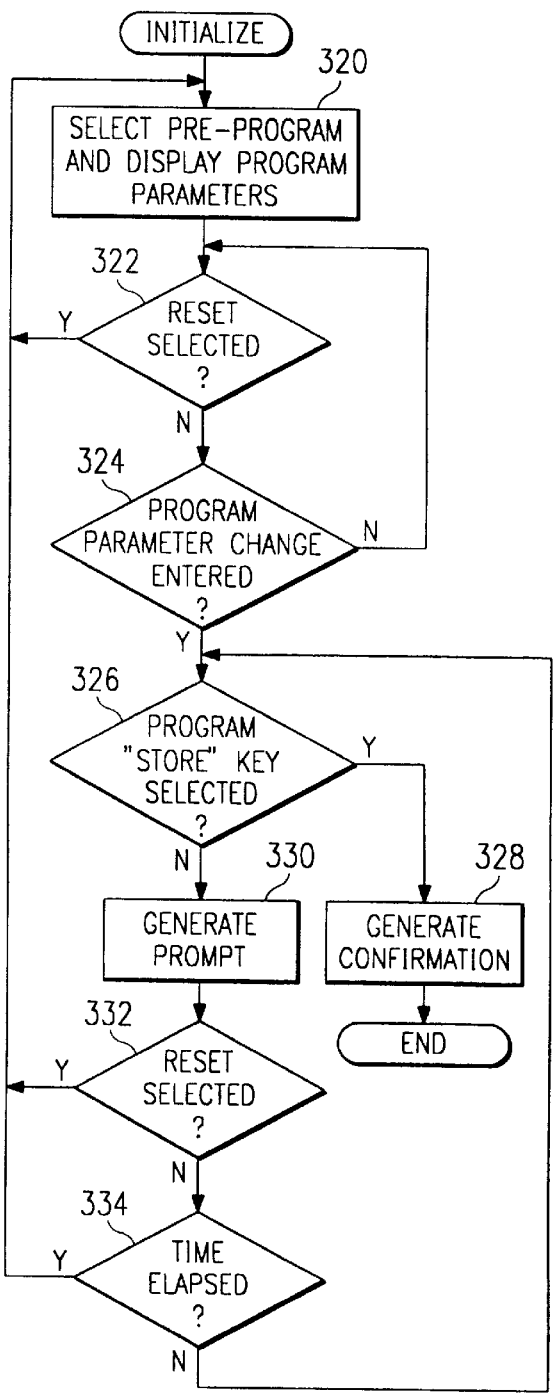

ENHANCED HIGH PRESSURE CLEANSING SYSTEM FOR WAFER HANDLING IMPLEMENTS

FIELD OF THE INVENTION

The invention relates to semiconductor manufacturing, and more particularly to the cleansing of wafer handling implements that are used incident to the manufacture of semiconductor devices.

BACKGROUND OF THE INVENTION

The manufacture of semiconductor devices is a time consuming process that requires high levels of cleanliness throughout the many phases of the manufacturing process. Many steps of manufacturing are conducted in various classes of "clean rooms" having purified air flows to reduce the incidence of airborne particle contaminants to prescribed levels. Clean rooms are typically designated in accordance with the number of permitted contaminants of a prescribed size per cubic foot of airspace. For example, much semiconductor manufacturing is presently conducted in Class 10 clean rooms, which have filtered air flows to permit no more than 10 particles per cubic foot of up to $0.5\mu$ in size. Nevertheless, wafers upon which the semiconductor devices are assembled can become contaminated, and therefore rendered defective, by contaminants that are introduced at various process steps. For example, contamination can arise from incomplete cleansing of reagents from the wafer handling apparatus, and the like. The presence of such contaminants can have a catastrophic impact on product yield, notwithstanding an otherwise proper and complete formation of the semiconductor device. Moreover, although the wafers themselves can be properly cleansed of reagents and the like that are used incident to various manufacturing steps, the wafer handling equipment, for a variety of reasons, may not be completely cleansed of the reagents and may therefore serve as source of wafer contamination for subsequent batches of wafers. Unfortunately, the prior art to date has not properly and fully addressed this latter aspect of contamination, and has instead sought to improve product yield by addressing other aspects of semiconductor device manufacture.

Prior efforts to cleanse wafer handling implements have not been entirely compatible with other aspects of device manufacture. For example, one known prior cleansing method within the clean room provided for the use of a pressurized stream of air that was directed at a wafer handling implement such as a wafer cassette or boat. While this cleansing practice was convenient and expedient, it had the unfortunate consequence of creating turbulence in the airflow within the clean room and introducing particulate contaminants into the clean room airstream, which resulted in increased particle contaminant concentrations at other processing stations within the clean room. While the spread of airborne contaminants was rectified by termination of this cleansing regimen, the cleansing regimen itself was not replaced. Therefore, the original problem associated with contaminated wafer handling implements has largely remained uncorrected. Accordingly, there exists in the semiconductor manufacturing industry a need for wafer handling cleansing methods and apparatus which remove particulate contaminants from wafer handling implements such as wafer cassettes and the like prior to their contact with wafers at various stages of manufacture. The provision of such methods and apparatus could reasonably be expected to increase product yield and therefore result in a corresponding increase in manufacturing efficiency.

SUMMARY OF THE INVENTION

Methods and apparatus are providing for cleansing contaminants from substrates, such as semiconductor wafer handling implements, and thereby reduce the incidence of contamination of semiconductor devices being assembled upon the semiconductor wafers.

In one aspect of the invention, a substrate such as a semiconductor wafer cassette or other semiconductor wafer handling implement, is inserted into a processing chamber. A pressurized, and optionally purified, cleansing medium is directed against at least one surface of the substrate to dislodge contaminants from the substrate surface. Dislodged contaminants are evacuated with negative pressure from the chamber, thereby reducing the concentration of contaminants on the substrate. In a preferred aspect of the invention, the cleansing medium is an inert gas, such as nitrogen, which can be readily manufactured and supplied at semiconductor manufacturing sites. The cleansing medium is applied to the substrate at a pressure from about 10 p.s.i. to about 100 or more p.s.i. Such pressures have been found to be particularly suitable for removing contaminants of the type that are typically accumulated on wafer handling equipment such as wafer cassettes. The chamber can be provided with sidewalls that define a convergent evacuation path in fluid communication with an exhaust stream, such as the exhaust stack of the manufacturing facility. The exhaust stream preferably has a flow rate of at least 10 c.f.m., and preferably at least 75 c.fm. or greater to ensure optimal evacuation of dislodged contaminants from the chamber. Exhaust stream flow rates of up to 500 c.f.m. or more can also be provided to further enhance the cleansing process. The concentration of contaminants can be monitored by introducing a particle monitor in the fluid flow path of the processing chamber or the exhaust conduit.

BRIEF DESCRIPTION OF THE DRAWINGS

The foregoing and other features and advantages of the present invention will become apparent to those skilled in the art from a reading of the accompanying detailed description of the invention, taken together with the accompanying drawings, in which:

FIG. 2 is a top elevation view of the device depicted in FIG. 1 with the device cover in an "open" position to illustrate details of the device processing chamber;

FIG. 3 is a rear view of the device depicted in FIG. 1;

FIG. 4 is a sectional view along the line 4—4 of FIG. 1;

FIG. 5 is a top elevation view of the device illustrated in FIG. 1 with the device cover in a closed position;

FIG. 6 is an alternate control panel for the cleaning instrument of FIG. 1;

FIG. 7 is a flow diagram of control panel operation following power-up and running of self-diagnostics;

FIG. 10 is a flow diagram of a pre-programmed processing operation; and

FIG. 11 is a flow diagram of the controller processing regimen for implementing a program edit.

DETAILED DESCRIPTION OF THE PREFERRED EMBODIMENTS

Figure 1:
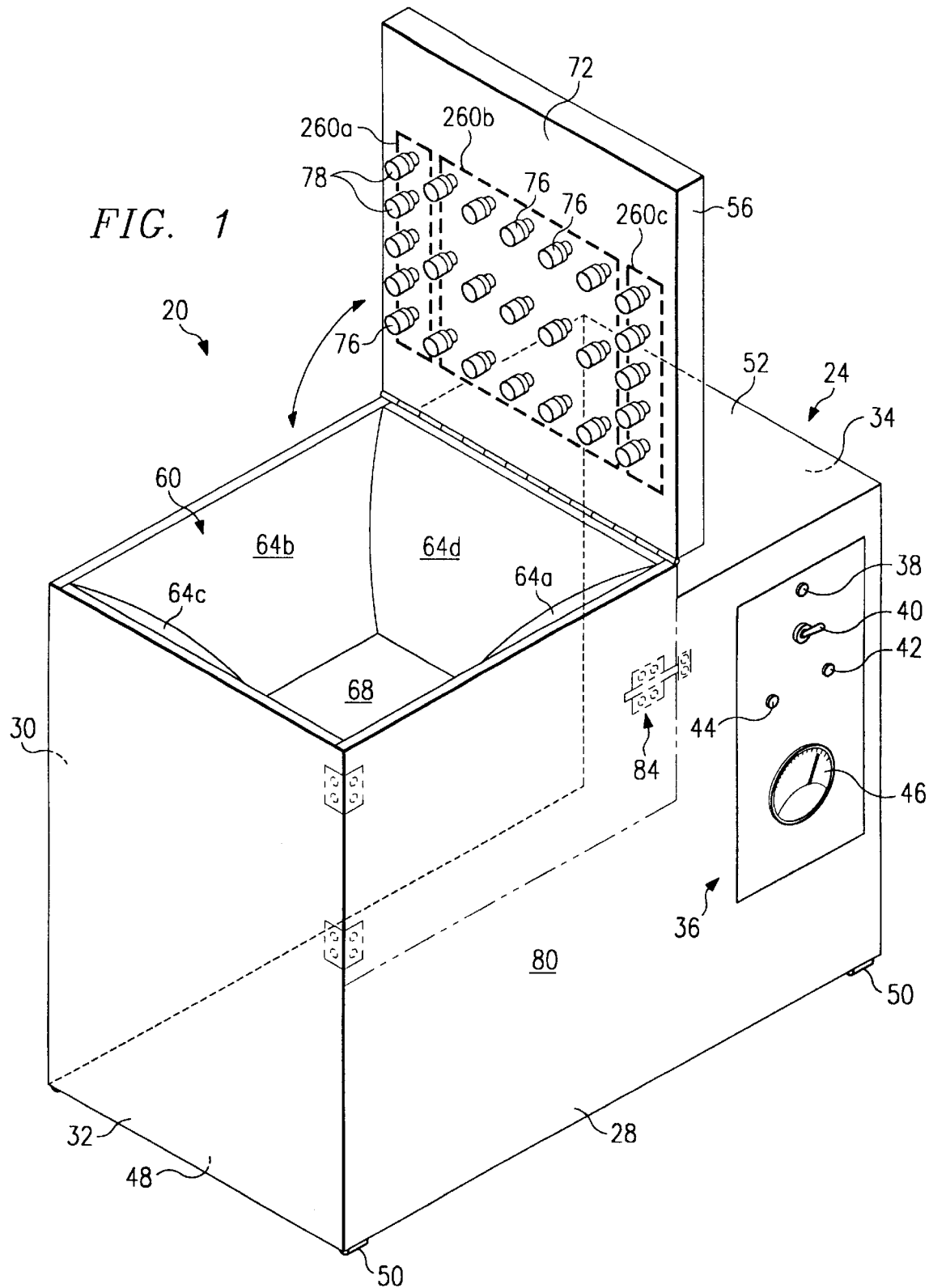
FIG. 1 is a perspective view of a cleansing instrument in accordance with the present invention.

With reference to the drawings, wherein like reference characters represent corresponding parts throughout the various views, and with particular reference to FIG. 1, there is depicted a substrate cleansing system in accordance with the teachings of the present invention, designated generally by reference character 20. The cleansing system 20 is particularly useful for cleansing implements such as wafer cassettes and the like that are used in the handling and/or processing of wafers of semiconductor material incident to the manufacture of semiconductor devices. However, it is to be appreciated that the teachings of the present invention as described below can be used to cleanse implements that are used in other manufacturing processes.

The cleansing system 20 is comprised of a housing 24 that includes opposing front and rear panels 28 and 30, and side panels 32 and 34 respectively. A control panel 36 is provided at the front panel 28 to permit for the entry of various user inputs and to display various types of information relating to various aspects of device operation. The control panel includes visible indicia of system readiness, such as a "Power" light 38, which confirms placement of a power switch 40 in an appropriate position, such as an "on" or "standby" position. A processing cycle of prescribed time duration can be initiated by appropriate manipulation of start selector 42. A cycle reset selector 44 can be manipulated in an appropriate manner to ready the system for commencement of a new processing cycle, as when conditions inhibit commencement of a cycle following actuation of "start" selector 42. As will be more fully described below, the processing system monitors various parameters to inhibit system operation in instances where prescribed conditions are not satisfied. Such parameters can include, by way of non-limiting example, cleansing medium supply line pressure and exhaust vacuum pressure, one or more of which can be displayed in an appropriate manner on the control panel 36.

The housing 24 includes a base 48 that can be supported by legs 50 which can optionally be in the form of casters, self-leveling legs, or other suitable supports. An upper surface 52 of the housing 24 includes a cover or lid 56 that is pivotably connected to a remaining portion of the upper surface by suitable means, such as a hinge coupling (not shown). The cover 56 provides access to the interior of the cleansing system 20, and more particularly, to the system processing chamber 60. The processing chamber is defined by opposed sidewalls 64a–64d which define a quadrilateral, a floor 68, and the inner surface 72 of the lid 56. The sidewalls can optionally be provided with a curvilinear, as opposed to planar, configuration, as shown in the drawings. Alternatively, the processing chamber 60 can be defined by a structure, such as a circular or oval cylinder, having a curvilinear sidewall and floor. Configuration of the processing chamber in any of the foregoing manners provides a processing chamber that is substantially, although preferably not completely, isolated from the environment surrounding the cleansing system 20 for reasons that will be more fully described below.

One or more of the chamber sidewalls 64, base 68 and the inner surface 72 of the lid 56 can be formed from an electro-polished stainless steel, such as 304- or 316-grade stainless steel to facilitate the separation and removal of contaminants from a substrate received within the chamber 60. Formation of these surfaces in this manner renders a hardened, flat surface that is substantially devoid of surface irregularities, thereby facilitating the passage of dislodged contaminants there along incident to the cleansing process, as will be described in greater detail below.

An array of nozzles 76 is secured or otherwise mounted along the inner surface 72 of the lid 56 and is operable to deliver a pressurized stream of cleansing medium through nozzle apertures 78 to a substrate, such as a wafer cassette or other wafer handling implement, received within the cleansing chamber 60, as will be described in greater detail below. One or more of the nozzles 76 can optionally be arranged to direct a cleansing medium stream that is angled with respect to the cleansing medium streams emitted by the remaining nozzles. Moreover, one or more of the nozzles can instead be coupled to a supply (not shown) of a suitable deionizing medium to deliver the deionizing medium to the processing chamber. The nozzles 76 can be repositioned along the lid inner surface 72 in an appropriate manner in accordance with such factors as the dimensions and configuration of the substrate to be cleansed, the composition of the substrate, desired cleansing medium spray pattern, and the like.

An access door 80 that is formed within one of the front (28), rear (30) or side (30/32) walls of the system, as shown in phantom in the drawing, can optionally be provided to afford supplemental access to the processing chamber 60. Alternatively, the door 80 can be provided in lieu of the hingedly securable lid 56 to simplify the cleansing system manufacturing and reduce associated expenses. Processing chamber access from the side rather than the top can be beneficial in instances, such as when handling quartz wafer cassettes and other contaminant sensitive and/or heated or supercooled substrates, where tongs (not shown) and other special handling implements may be required. Access door 80 can be hingedly coupled to a sidewall, such as sidewall 36, and is securable in a closed position by a conventional latch or other suitable locking mechanism, such as that designated by reference character 84.

Further features of the cleansing system 20 are illustrated in FIG. 2. A pressurized flow of cleansing medium is supplied to the processing chamber 60 from an associated supply tank (not shown) or, more preferably, by means of a supply line 88 that is connected to a facility reservoir. The cleansing medium is preferably in the form of a pressurized, and optionally purified, gaseous flow. Use of an inert gas is preferred so as to avoid interaction between the cleansing medium and the contaminants carried by the substrate. As Nitrogen is used in other aspects of semiconductor manufacturing and is available in highly purified concentrations, its use as a cleansing medium is particularly advantageous. However, other appropriate cleansing mediums, such as purified, dehydrated air and other fluids that are non-reactive with contaminants that may be present on a given substrate, can be substituted for the inert gas.

The cleansing medium is conveyed from its inlet connection 92 (FIG. 3) along the rear panel 30 to the nozzle array 76 (FIG. 1) through an internal conduit 96. Delivery of the cleansing medium into the conduit 96 is regulated by an appropriate flow control device, such as solenoid 98 or other precision valving device. Conduit 96 is coupled to an external, flexible hose 100 through appropriate fittings, such as high pressure threaded fittings 102, 104 that are respectively mounted to the rear wall 30 and lid 56 of the cleansing system 20. The ends of the hose 100 are provided with fittings 103 and 105 that are configured complementary to fittings 102 and 104 to securely engage the fittings 103 & 105. Electrical power is supplied by a conventional 110 volt power line 106 or by other suitable sources of electrical power. Supplied electrical power is managed and processed in an appropriate manner to provide for powering of the various system relays, circuits and control apparatus, as well as the control panel 36.

With reference to FIG. 2, there is illustrated a substrate 110 in the form of a quartz wafer cassette that is received within the processing chamber 60 of the cleansing system. While a quartz wafer cassette is discussed in the following description, it is to be understood that the principles of the invention are equally applicable to non-quartz wafer cassettes, as well as to other types of wafer handling and other, non-wafer handling implements. The wafer cassette 110 includes plurality of wafer supports 112 that are arranged parallel to one another. Each support 112 includes a plurality of transversely extending slots 114, each of which is dimensioned to receive a wafer of semiconductor material therein. In the illustrated wafer cassette 110, the number of wafer slots 114 has been greatly reduced, and the spatial dimensions of the slots have been exaggerated with respect to the dimensions and structure of conventional quartz wafer cassettes for reasons of clarity. The wafer cassette 110 is supported in the processing chamber 60 by a mounting rack 118 that is dimensioned and configured to support the substrate 110 above the processing chamber floor 68. When quartz cassettes are to be cleansed, the rack 118 is preferably formed from various resins or polytetrafluoroethylenes ("PTFE's") to avoid reaction with, or retention of, contaminants introduced into the processing chamber 60 by a substrate to be cleansed. When polypropylene and other non-quartz implements are to be cleansed, the rack 118 can be formed from an electro-polished stainless steel, such as 304- or 316-grade stainless steel.

As is illustrated more clearly in FIG. 4, the processing chamber base 68 is preferably sloped downwardly and away from the substrate 110 so as to facilitate conveyance of dislodged contaminants from the processing chamber 60 and into the exhaust stack (not shown) of the manufacturing facility. Connection to the exhaust stack is through an exhaust conduit 120 that extends from the rear wall 30 of the system. Alternatively, the exhaust conduit 120 can be positioned so as to extend from the chamber floor 68 to more fully utilize the effects of gravity. Exhaust stacks are typically continuously operable in semiconductor manufacturing facilities and generally exhibit flow rates of between 25 and 1,000 c.f.m. in accordance with, among other factors, the demands associated with various process steps. It is to be appreciated that connection to the exhaust stack creates a negative pressure within the processing chamber 60 which, in and of itself, tends to draw dislodged contaminants away from the substrate 110 and into the exhaust stack through the exhaust conduit 120. A suitable particle monitor 122, such as an in-situ particle monitor or residual gas analyzer, can be coupled to exhaust conduit 120 to provide feedback via lead 123 in an appropriate manner regarding the level of contaminants in the fluid flow evacuated from the processing chamber. Depending on the extent of negative pressure generated by such a connection, an inlet or vent 124, as shown in FIG. 5, can optionally be provided to facilitate the ease with which the cover 56 can be elevated from the closed position shown in FIG. 5 to the open position shown in FIG. 1. Alternatively, an iris, shutter or other suitable valving device can be provided at the exhaust conduit to selectively regulate communication between the processing chamber 60 and the exhaust stock. However, provision of vent 124 is desirable, for it allows for continuous cleansing of the processing chamber with ambient clean room air. Manipulation of the lid 56 can be further facilitated through provision of a handle 128 that can be connected to the lid or incorporated therein in a conventional manner.

Operational safeguards, such as a lid interlock switch 130 and exhaust interlock 134, as depicted in FIG. 3, can optionally be provided to facilitate safe operation of the processing system 20. For example, the lid interlock 130 can be operable to maintain the lid 56 in a closed position, as shown in FIG. 3, once the cleansing cycle has been initiated, as by depression of the start button 44 (FIG. 1), as well as to communicate with solenoid 98 to inhibit the release of pressurized cleansing fluid to the nozzles 76 in the absence of engagement of the interlock 130. Likewise, the exhaust interlock 134, which can been in the form of a diaphragm-type valve, is operable to sense negative pressure through the exhaust conduit 120 and to inhibit operation of the system in instances where the sensed negative pressure is below a predetermined threshold value.

System Operation

A detailed description of the operation of the cleansing system 20 of the present invention will now be provided in connection with the cleansing of a substrate 110 in the form of a semiconductor wafer cassette, although it is to be appreciated and understood that the following description is likewise applicable for the cleansing of multiple and/or various other substrates, such as other types of semiconductor wafer handling implements, as well as other types of items for which cleansing is desirable.

With particular reference to FIGS. 1 and 2 of the drawings, a wafer cassette 110 is inserted into the processing chamber 60 for cleansing prior to use with a semiconductor wafer (not shown) at any of a variety of stages of wafer processing. The wafer cassette 110 is positioned on the rack 118 that is received within the processing chamber 60 so as to support the cassette 110 above the angled processing chamber floor 68. The rack 118 can optionally be configured to retainably engage the cassette 110 and to position the cassette in a predetermined orientation within the processing chamber 60 and with respect to the one or more rows of cleansing nozzles 76 that are provided along the inner surface of the lid 56.

Once the cassette 110 is received within the processing chamber 60 in the foregoing manner, the lid 56 is displaced from the open position (FIG. 1) to the closed position illustrated in FIG. 4, and the processing system 20 is turned on, as can be accomplished by toggling the switch 40 (FIG. 1) from the "off" position to the "on" position. Displacement of the power switch in the foregoing manner illuminates power indicator light 38, thereby confirming the delivery of power to the system. Safety interlock 130 (FIG. 3) generates appropriate signal input to confirm lid closure. In addition, appropriate signal input is provided by the exhaust interlock sensor 134, which is operable to provide "go\no go" status with respect to negative pressure supplied to the processing chamber 60 through the exhaust conduit 120. Such negative pressure is obtained from the connection of the exhaust conduit 120 to the exhaust stack of the manufacturing facility, as has been described previously. In a preferred aspect of the invention, commencement of a cleansing cycle can be accomplished only after receipt at the control panel 36 of favorable signal output from the lid interlock and exhaust interlock sensors 130 & 134, respectively, so as to inhibit operation of the cleansing system outside of prescribed operational parameters, such as incomplete lid closure and insufficient exhaust flow rate.

The cleansing cycle is started by depressing the start button 44 (FIG. 1), which initiates the release of fluid conduit solenoid valve 98, thereby freeing the flow of cleansing medium to the array of nozzles 76. While a variety of cleansing mediums can be implemented with the practice of the present invention, in a preferred aspect of the invention, the cleansing medium is gaseous nitrogen, which is typically available in semiconductor wafer manufacturing facilities in high purity. Such nitrogen is typically supplied at a line pressure of about 100 p.s.i. However, the nitrogen is preferably delivered to the nozzles 76 at a pressure of from about 10–100 p.s.i. in accordance with the structure and configuration of the nozzle outlets 78 and the number and array of nozzles. Dynamic pressure at the nozzle can be sensed in a conventional manner and indicated at the control panel pressure gauge 46. Alternatively, the gauge 46 can be connected to the supply line of the cleansing medium to provide an indication of static supply line pressure. Simultaneous displays of both of the foregoing pressures can also be provided.

The cleansing cycle is defined by a predetermined time interval, which is optimally between about 30–120 sec. at a nozzle pressure of between about 30 and 75 p.s.i.

Tables 1 and 2 provide measured data that was obtained prior to and following processing of various types of wafer cassettes in accordance with the present invention. Table 1 provides data that was obtained with respect to three types of wafer cassettes: carrier cassettes, oven cassettes, and etch cassettes. Table 2 provides data that specifically relates to the cleansing of etching cassettes. Carrier cassettes provide for the transportation of wafers between processing sites, at which the wafers are off-loaded to other types of cassettes, such as oven cassettes and etch cassettes that are designed and fabricated for specific types of processing. For example, furnace cassettes are typically fabricated from quartz so as to withstand high temperature processing in furnaces at temperatures in excess of 800° C. Etch cassettes are formed from various acid resistant materials, such as certain plastics and members of the polytetrafluoroethylene ("PTFE") family. All of the wafer cassettes included in Tables 1 and 2 were processed under the following conditions:

Cleansing medium line pressure: 100 p.s.i.

Cycle duration: 30 seconds

Cleansing medium: gaseous nitrogen

Exhaust stack flow: 25–150 c.f.m.

TABLE 1

| Cassette Type/No. | Particle Count | |
|---|---|---|
| | Before Processing | After Processing |
| Carrier/1 | 5 | 1 |
| Carrier/2 | 19 | 11 |
| Carrier/3 | 195 | 0 |
| Carrier/4 | 15 | 8 |
| Carrier/5 | 88 | 2 |
| Carrier/6 | 27 | 12 |
| Carrier/7 | 56 | 19 |
| Carrier/8 | 29 | 40 |
| Carrier/9 | 10 | 4 |
| Carrier/10 | 73 | 1 |
| Carrier/11 | 33 | 4 |
| Oven/1 | 362 | 75 |
| Oven/2 | 239 | 17 |
| Oven/3 | 20 | 2 |
| Oven/4 | 176 | 0 |
| Oven/5 | 176 | 0 |
| Oven/6 | 41 | 0 |
| Oven/7 | 89 | 0 |
| Oven/8 | 7 | 0 |
| Etch/1 | 4 | 0 |
| Etch/2 | 2 | 1 |
| Etch/3 | 12 | 1 |
| Etch/4 | 3566 | 853 |
| Etch/5 | 3 | 3 |

TABLE 1-continued

| Cassette Type/No. | Particle Count | |
|---|---|---|
| | Before Processing | After |
| Etch/6 | 1533 | 241 |
| Etch/7 | 2367 | 449 |
| Average Pre-Processing Particle Count: | | 351.8 |
| Average Post-Processing Particle Count: | | 67.1 |
| % Particle Reduction: | | 80.9 |

TABLE 2

| Cassette Type/No. | Particle Count | |
|---|---|---|
| | Before Processing | After Processing |
| Etch/1 | 290 | 49 |
| Etch/2 | 207 | 24 |
| Etch/3 | 489 | 31 |
| Etch/4 | 18 | 2 |
| Etch/5 | 660 | 79 |
| Etch/6 | 2203 | 143 |
| Etch/7 | 631 | 222 |
| Etch/8 | 193 | 138 |
| Etch/9 | 1319 | 170 |
| Etch/10 | 1494 | 177 |
| Average Pre-Processing Particle Count: | | 750 |
| Average Post-Processing Particle Count: | | 103.5 |
| % Particle Reduction: | | 86.7% |

The empirical data obtained from the foregoing evaluations indicated an improvement in wafer cassette cleanliness of between about 80%–about 90%. Accordingly, wafers transported by the various cassettes that were cleansed in the foregoing manner were subjected to 80–90% fewer contaminants than to which they otherwise would have been subjected.

The foregoing cleansing process provided a contaminant reduction that was far greater than ever anticipated by the inventors. In related tests, the foregoing cleansing practices resulted in a yield improvement for short flow lots of between 5 and 11%, even when "best" practices, where cost was of secondary consideration, were implemented.

In a further aspect of the invention, the processing system 20 of the present invention is provided with an electronic control system that is preferably of a type which is operable to monitor and control a variety of system performance parameters, as will be described in greater detail below. Included among the performance parameters is a pulsing regimen for the application of cleansing medium, as will be also be described in detail below.

An electronic control panel in accordance with the teachings of the present invention is denoted generally by reference number 150 in FIG. 6 and can be added to the system 20 to augment or replace panel 36 illustrated in FIG. 1. The control panel can be in the form of a reconfigurable commercial-grade operator interface unit, such as a Nematron Series 200C PLC graphics workstation, manufactured by Nematron Corporation of Ann Arbor, Mich. The control panel can be configured in the manner depicted in FIG. 6 to include a status display screen 154, a plurality of pre-programmed functionality keys 156, a plurality of alphanumeric data input keys 158, a reset/abort key 160, and a cycle start key 162. Each of the pre-programmed functionality keys 156 can be provided with discrete processing regimens in accordance with such factors, for example, as the type of implement to be cleansed, as different implements by virtue of their use environment, structural configuration and the like can require different cleansing regimens. As will be discussed below, cleansing regimens can differ by having different time periods of cleansing medium application and cleansing medium application pressure, as well as pulse frequency and pulse duration of cleansing medium application, and the "settle time" between adjacent pulses.

The display screen 154 is preferably an alpha-numeric display that is capable of depicting various operational status parameters, such as error codes, data entry from selection of one or more of the input keys 158, elapsed time, particle count (when the processing system is connected to optional particle monitor 122 (FIG. 4), program entry/edit commands, and the like. With particular reference to the data entry keys 158, such keys are generally comprised of the following types: (a) multi-function alpha-numeric input keys 164–182 which respectively correspond to numbered keys 0–9; (b) multi-function program edit and store keys 184 & 186; (c) multi-function access keys 188, 190 & 192 for accessing various of the functions (such as alpha-numeric and arithmetic functions) embedded in input keys 164–182; (d) specific processing function keys 194 ("Time"), 196 ("Cycle/Count"), 198 ("Pulse Time"), and 200 ("Settle Time"); and (e) system data/access/function entry key 202 ("Enter").

As will be more fully described below, functionality of the processing system can be modified in accordance with entry of specific commands that are associated with corresponding control panel keys 156–202. For example, the duration of a processing cycle can be selected by depressing "Time" key 194, selecting one or more of the keys 164–182 corresponding to the desired time period (usually in seconds), and then depressing "Enter" key 202. A pre-existing program can be selected by depressing one of the pre-programmed keys 156 and depressing "Enter" key 202. Processing until a desired particle count is attained within the processing chamber 60 can be accomplished by depressing "Cycle/Count" key 196 followed by one or more of the keys 164–182 which correspond to the desired contaminant level, and depressing "Enter" key 202. This will provide for processing until attainment of output from particle monitor 122 indicative of the selected particle count. The key designated "Pulse Time" 198 allows for entry of a desired time period for application of a cleansing medium pulse. The key designated "Settle Time" 200 allows for entry of a time period between pulses, during which cleansing medium is not expelled into the processing chamber 60. Processing for a predetermined number of cleansing medium application cycles can be selected by depressing "Cycle/Count" key 196 an appropriate number of times, such as two, followed by entry of the specific number of cycles via selection of one or more of the keys 164–186, followed (optionally) by selection of "Pulse Time" key 198 in the manner set forth above.

With reference to FIGS. 7–10, there are depicted flow diagrams of the logic steps employed by the control panel 150 and related power supplies, relays, valving hardware and the like in accordance with the teachings of the present invention. With particular reference to FIG. 7, there is depicted a high level diagram of control panel operation following powering-up of the system and running of self-diagnostics in a manner well known to practitioners in the relevant art. Upon initialization, the status of the system is indicated in screen display 154 (FIG. 6), as indicated by block 210, and the system is operable to monitor selection of various inputs, as indicated by decision blocks 212, 214, 216 and 218. While the following description addresses the decision blocks 212–218 in a sequential manner, it is to be understood that such a sequential process is not necessarily indicative of the manner in which software associated with the control panel implements this interrogative process. For example, the following interrogative process can be accomplished substantially simultaneously, or sequentially, but in a different order from that set forth below, as is known to persons of ordinary skill in the programming art.

Decision block 212 relates to whether or not the "START" key 162 has been depressed, the selection of which will direct the control panel to implement the last selected program entry, as indicated by block 220. In instances where the "START" key has not been depressed at a given point in time, the control system is operable to evaluate selection of other inputs 214–218. For example, block 214 relates to whether a pro-programmed function key 156 has been selected, in which case the control panel recalls the selected program from associated memory and executes the recited program steps, as indicated by block 222. Such pre-programmed functions can include, by way of non-limiting example, programs directing the application of cleansing medium in a discontinuous (i.e., pulsed) manner with prescribed pulse durations and "settle times" between pulses, for a prescribed time interval or until a predetermined particle count has been attained. As will be discussed in further detail below, it can be desirable to select from a variety of different cleansing medium application regimens in order to implement cleansing of different types of substrates, such as semiconductor wafer etch, photoresist and carrier cassettes, cassette-related handling implements, and the like. In the absence of selection of either of the "START" or "PRE-PROGRAMMED CYCLE SELECT" functions, the control panel 150 is operable to evaluate selection of "EDIT" key 184, as indicated by block 216. In instances where "EDIT" has been selected, the associated program parameters, such as any one or more of pulse settle times, cycle duration, number of pulse applications per cycle, particle count, and the like, will be recalled from associated program memory (not shown) and displayed either simultaneously or sequentially on the control display screen 154 for review and/or edit, as indicated at block 224. Editing can be accomplished in any of a variety of conventional manners, as by advancing a screen cursor to a desired parameter entry and overwriting the existing entry with a new entry. Revised programs can be stored by any of a variety of suitable, conventional storage regimens, such as selection of "SORE" key 186 and designation of an appropriate recallable storage address in memory. In the absence of selection of any of the foregoing "START" (block 212), "PRE-PROGRAMMED CYCLE" (block 214) or "EDIT" (block 216) functions, the control panel is operable to evaluate selection of an appropriate keypad entry allowing for downloading of a program from a host computer (block 218) with which the control panel can be selectively associated in a conventional manner. In such instances, the program is received at an appropriate address in control memory (block 226) for subsequent recall and/or use in the manner described above.

Figure 8:
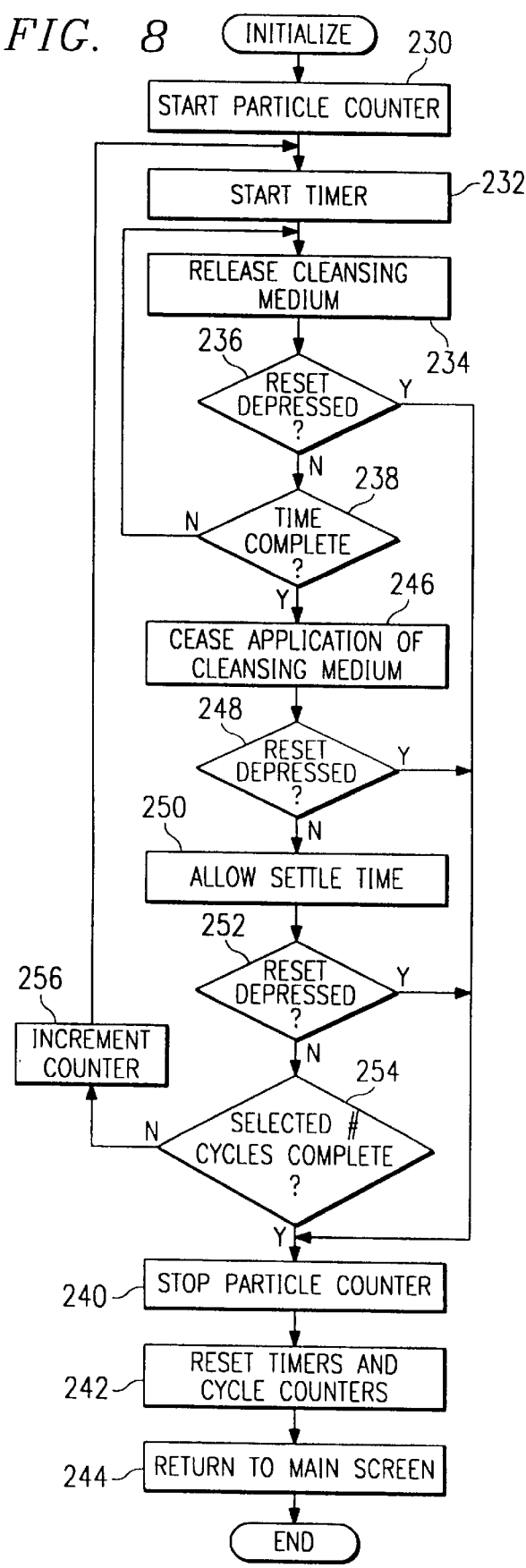
FIG. 8 is a flow diagram of the pulse processing of a substrate.

Details of the program logic that is associated with the pulse processing of a substrate are illustrated in FIG. 8. With reference to the drawing, the particle counter 122 (FIG. 4) is reset and started following entry of the appropriate processing parameters, such as process time, pulse duration settle times, number of pulse cycles, and the like, and the timer is started, as indicated by blocks 230 and 232, respectively. Cleansing medium is released to the nozzles 76, as by actuating solenoid/valve 98 (FIG. 3) to open inlet conduit 96 (block 234), until the first to occur of an external interruption, such as depression of "RESET/ABORT" key 160 (block 236) or passage of the selected or programmed cleansing medium application time (block 238). In instances where the "RESET/ABORT" key has been depressed, the particle count is terminated (block 240), all timers and cycle counters are reset (block 242), and the control panel returns to the main screen display, as indicated by block 244.

In the absence of an interruption, such as depression of "RESET/ABORT" key 160, or the passage of the prescribed pulse interval (typically measured in seconds or fractions of a second), appropriate signal input is directed to solenoid/valve 98 to remain in the "open" position so as to permit the flow of pressurized cleansing medium to the applicator nozzles 76. Upon passage of the prescribed pulse interval, appropriate signal input generated by the control panel 150 to direct closure of solenoid/valve 98 so as to terminate application of cleansing medium, as indicated by block 246. In the absence of external interruption, such as depression of "RESET/ABORT" key 160 (block 248), the prescribed settle time is permitted to pass, as indicated by block 250. The control system again monitors for the depression of "RESET/ABORT" key 160 (block 252) and, in the absence of such, evaluates whether or not the prescribed number of pulse/settle cycles has been completed, as shown by block 254. In the absence of completion of the prescribed number of pulses, a cycle counter is incremented (block 256), the timer is re-started, and the foregoing program flow is repeated. If the prescribed number of pulse/settle cycles has been completed, the particle counter is terminated, as indicated by block 240, and the ensuing actions referenced in blocks 242 & 244 are implemented in the manner described above. Actuation of "RESET/ABORT" key 160 following passage of the prescribed settle time (block 250) directs stoppage of the particle counter (block 240) and processing in accordance with blocks 242 & 244 as set forth above.

The foregoing protocol for a pulse cleansing regimen is applicable to a wide range of cleansing cycles, during which cleansing media can be applied for periods as brief as fractions of seconds to periods of 30 or more seconds. However, for some substrates, it can be more desirable to apply relatively short duration pulses in rapid succession to effect cleansing, as some contaminants are more responsive to the initial, high-pressure blast of the cleansing medium than to the prolonged application of a cleansing medium stream. It is for this reason that it is preferable to provide for individual setting of pulse application and settle times. The settle time can be related to the pulse time by a fractional or whole number increment. Typical relationships between pulse application and settle times can range, for example, from 1:1 to 1:4 (i.e., settle time is up to about four times the duration of the pulse application time). Moreover, for a given program cycle, it is possible to vary one or both of the pulse application and settle times, as well as the ratio between these time values. It is further possible to institute a regimen of pulse "sweeping" within the processing chamber by applying cleansing medium in a sequential manner to discrete groups of nozzles 76 to effectuate the application of cleansing medium from one side of the chamber to the other side. Alternatively, the cleansing medium can be applied to discrete groups of nozzles 76 in a non-progressive manner in an effort to increase turbulence within the processing chamber 60.

Figure 9:
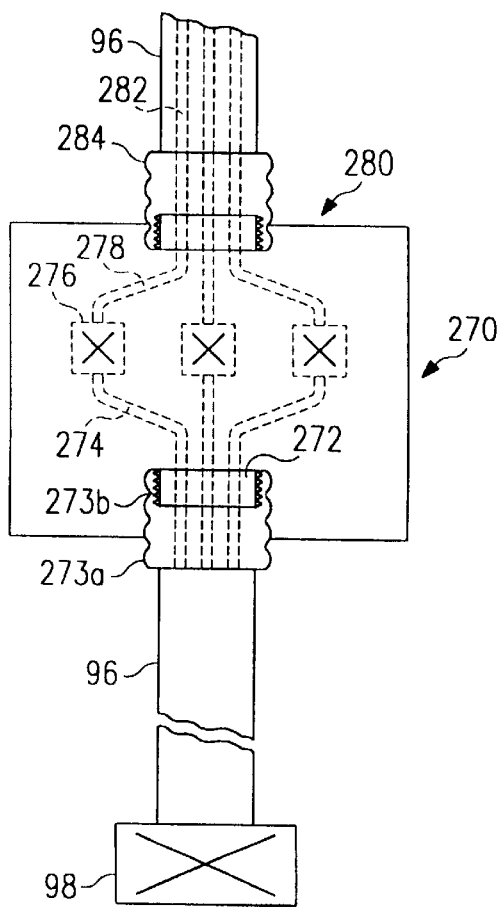
FIG. 9 shows a system for Independently delivering cleansing medium to groups of nozzles.

As has been noted above, nozzles 76 can be arranged into discrete groups, such as the three groups 260a–260c indicated in phantom in FIG. 1. When the nozzles are arranged into a multitude of groups, each group is to be supplied with cleansing medium independently of the nozzles constituting the other nozzle groups. One arrangement for implementing such independent delivery is illustrated in FIG. 9, in which the fluid inlet 96 upstream of the flow controller/solenoid 98 (i.e., between the flow controller 98 and nozzles 76) is provided with a flow diverter unit, indicated generally by reference numeral 270, to which the inlet 96 can be coupled by appropriate fluid couplings, such as threaded connector 273 which, together with the flow diverter unit 270, are provided with mutually engageable threaded surfaces 273a and 273b.

The diverter unit 270 includes a flow divider plate 272 which provides for the partitioning of the incoming supply of cleansing medium into a multitude of discrete sub-flows, of which three are illustrated. It is to be appreciated that a greater or lesser number of sub-flows can be created by the divider plate 272 or other equivalent structures. A fluid line 274 extends from the divider plate 272 to a corresponding flow control device 276, such as a solenoid or other high pressure flow control device. Each of the flow control devices can be independently controllable by the controller 150 in a manner well known in the art so as to separately bias the controllers 276 between "open" and "closed" positions. An outlet line 278 extends from each flow controller 276 and extends to an outlet 280 of the diverter, where the outlet lines are connected through appropriate coupling apparatus 284 to corresponding fluid delivery lines 286 received within the inlet conduit 96 for delivery to their corresponding group of nozzles 260a–260c. Appropriate fluid distribution apparatus can be provided in the lid to divide the incoming fluid flows from delivery lines 282 to the plurality of nozzles 76 constituting the nozzle group.

With reference to FIG. 10, there is depicted the process logic employed by controller 150 to implement a pre-programmed processing regimen, as can be implemented by selecting one of the control pre-programmed keys 156 (FIG. 6). The selected program is presumed for the following discussion to provide for a predetermined cleansing medium pulse application regimen having preestablished pulse application and settle times that have been preprogrammed by a supplier or system user in the manner set forth above. A predetermined number of pulse application/settle cycles is preferably established in the program in order to prevent continuous operation of the cleansing system in instances where it is not possible to attain the set level of cleanliness for a given substrate.

Upon selection of the appropriate key 156 and selection of "START" button 162, the clock timer and particle counter are started, as shown by blocks 290 & 292. Cleansing medium is released (block 294) by proper manipulation of flow controller 98 (and optionally any one or more of auxiliary controllers 276), as elapsed time is monitored (block 296). In instances where the elapsed time has not attained the preestablished or program "set" time, the controller 150 is operable to continue with its count of particles, as indicated by block 298. The controller monitors the number of pulse application cycles (block 300) and, for so long as the elapsed time has not attained the "set" time (block 296), and the particle count has not attained the preestablished count limit (block 298), the controller continues to direct signal output to the flow controller 98 (and optionally controllers 276 (FIG. 9)) to provide for the continued release of cleansing medium. In instances where the "set" time (block 296), preestablished particle count (block 298) or cycle count (block 300) has been attained, the controller 150 directs the flow controller/solenoid 98 to close so as to terminate application of cleansing medium (block 302). The particle counter terminates its count, optionally displays on screen 154 the attained count or other message indicative of completion of a processing cycle, and resets (block 304), and the controller returns to its main screen display (block 306).

FIG. 11 depicts the controller processing regimen for implementation of a program edit. Program editing can be initiated by, for example, selecting controller "EDIT" key 184 followed selection of one of the pre-programmed keys 156 so as to edit a cleansing regimen that is stored in appropriate controller addressable memory, as indicated by block 320. Selection of a key 156 results in the display of the variety of parameters that constitute the programmed cleansing cycle. Such parameters can include, for example, the following: (1) process time; (2) individual cleansing cycle time; (3) pulse application time; (4) settle time; (5) number of cleansing cycles; and (6) lower limit of particle count. Following display of the program parameters, the controller is operable to determine whether or not "RESET/ABORT" key 160 has been depressed, as indicated by block 322. "RESET/ABORT" is selected in instances, for example, where the incorrect pre-programmed key 156 has been selected or the user does not desire to change any of the program parameters constituting the program. In instances where of "RESET/ABORT" key 160 has been depressed, the program returns to "idle" status, awaiting further input. In the absence of a "RESET" entry, the program awaits receipt of program parameter changes, as indicated by decision block 324, and selection of "STORE" key 186 to implement program storage (block 326), after which an appropriate program storage confirmation can be generated, as indicated by block 328. In the absence of selection of "STORE" key 186 following the entry of program parameter changes and the passage of a prescribed time interval, the program will generate an appropriate screen prompt (block 330) and await an appropriate user response. In the absence of selection of "RESET" (block 332), as could occur in instances where the user determined not to implement the keyed-in parameter changes, and the passage of a predetermined "lapse" time interval (block 334), the program returns to a "wait state" for entry of the "STORE" command at block 326. In the event of "RESET" selection or lapsing of a predetermined time interval, the program returns to the "wait state" to await entry of an appropriate command, as indicated at block 320.

Although the present invention and its advantages have been described in connection with the preferred embodiments, it is to be understood and appreciated that various changes, substitutions and modifications can be made herein without departing from the scope and spirit of the invention as defined by the accompanying claims. For example, it may be desirable to provide an automated control to the processing system to permit entry of a user variable processing time to custom tailor a processing cycle in accordance with the level of cleanliness and the type of substrate to be cleansed. Alternatively, the processing system could be modified to obtain particle count data from the processing chamber exhaust to permit for processing until a desired level of exhaust air cleanliness is attained, in which case the processing cycle would not be time dependent. Moreover, the cleansing medium could optionally be applied in a discontinuous manner during the course of a processing cycle, regardless of the processing cycle parameter that is employed (i.e., particle count or elapsed time).

What is claimed:

1. A system for cleansing a substrate, comprising:
a processing chamber dimensioned to receive a substrate;
at least one cleansing medium applicator connectable to a supply of cleansing medium and disposed to direct cleansing medium under pressure at a substrate received within said processing chamber;
an exhaust conduit in fluid communication with said processing chamber a one end and connectable to a source of negative pressure at another end to evacuate cleansing medium applied to the substrate;
a control system operable to regulate the delivery of cleansing medium to said at least one applicator in accordance with a predetermined criterion; and
a pulse control system operable to pulse application of said cleansing medium, wherein said pulse control system provides for selection of ate least one of pulse frequency, pulse application duration, and number of application cycles of said cleansing medium.

2. The system according to claim 1, wherein said cleansing medium is an inert gas.

3. The system according to claim 1, wherein said processing chamber is at least partially comprised of at least two adjoining sidewalls that are angled along intersecting planes.

4. The system according to claim 1, wherein said predetermined criterion is contaminant particle count.

5. The system according to claim 1, wherein said predetermined criterion is elapsed time.

6. The system according to claim 1, wherein said cleansing medium applicator comprises an array of applicator nozzles arranged in at least two discretely operable zones.

7. The system according to claim 1, wherein said cleansing medium applicator comprises an array of applicator nozzles arranged to deliver said cleansing medium along at least two directional planes.

8. The system according to claim 1, wherein said control system comprises a reconfigurable operator control panel.

9. The system according to claim 1, wherein said control system comprises a control panel having at least one user-programmable function key operable to store and to recall at least one cleansing operation parameter.

10. The system according to claim 9, wherein said at least one operation parameter comprises at least one of the following parameters: cycle duration, contaminant count, number of cycles, pulse frequency, and pulse duration.

11. The system according to claim 1, wherein said processing chamber is configured as a substantially closed chamber accessible through an access door.

12. The system according to claim 11, wherein said at least one cleansing medium applicator is mounted to said access door.

13. The system according to claim 11, further comprising a passage operable to deliver ambient air to said processing chamber.

14. A system for cleansing a substrate, comprising:
a processing chamber dimensioned to receive a substrate;
a plurality of applicator nozzles connectable to a supply of cleansing medium and disposed to direct cleansing medium under pressure at a substrate received within said processing chamber;
an exhaust conduit in fluid communication with said processing chamber at one end and connectable to a source of negative pressure at another end to evacuate cleansing medium applied to the substrate;
a control system comprising a pulse control system operable to selectively control at least one of the duration and frequency of delivery of cleaning medium to said plurality of applicator nozzles; and
a particle counter in fluid communication with said processing chamber, wherein said particle counter is operable to provide signal output to said control system indicative of one of a particle count or particle concentration in said processing chamber, and said control system is operable to deliver cleansing medium to said applicator nozzles until at least one of a predetermined particle count or particle concentration is attained.

15. The system according to claim 14, wherein said applicator nozzles are arranged to deliver said cleansing medium along at least two directional planes.

* * * * *